Figure 16A:
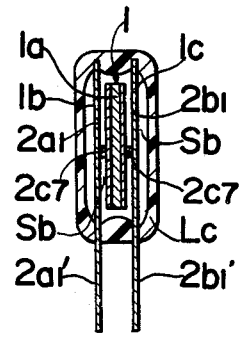

United States Patent [19]

Kakehi et al.

[11] 4,017,752
[45] Apr. 12, 1977

[54] PIEZOELECTRIC CERAMIC RESONATOR MOUNTING MEANS

[75] Inventors: Sasuga Kakehi, Kyoto; Jiro Miyazaki, Jyoyo; Jiro Inoue, Nagaokakyo, all of Japan

[73] Assignee: Murata Manufacturing Co., Ltd., Japan

[22] Filed: Dec. 12, 1974

[21] Appl. No.: 532,180

[30] Foreign Application Priority Data

Dec. 14, 1973 Japan ............................ 48-140935

[52] U.S. Cl. .................................................. 310/9.4
[51] Int. Cl.² ...................................... H01L 41/04
[58] Field of Search ................ 310/8.2, 8.9, 9.1–9.4

[56] References Cited

UNITED STATES PATENTS

| | | | |
|---|---|---|---|
| 3,622,816 | 11/1971 | McGrew | 310/9.4 |
| 3,643,305 | 2/1972 | Furnival | 310/9.4 |
| 3,747,176 | 7/1973 | Toyoshima | 310/9.1 X |

FOREIGN PATENTS OR APPLICATIONS

| | | | |
|---|---|---|---|
| 868,083 | 4/1971 | Canada | 310/9.4 |
| 45-7782 | 1970 | Japan | 310/9.1 |
| 44-16264 | 1969 | Japan | 310/9.1 |

*Primary Examiner*—Mark O. Budd
*Attorney, Agent, or Firm*—Craig & Antonelli

[57] ABSTRACT

A piezoelectric ceramic resonator to be used for an electric wave filter or an impedance transformer, and a manufacturing method of the ceramic resonator of the above described type, is provided in which a piezoelectric ceramic wafer, held at nodes or points close to the nodes of the electrodes of the wafer between outer terminal plates, is dipped in a melt, or the like, of gap-forming materials to form a first layer of such materials on the resonator with a second layer of porous thermosetting resinous material formed on the surface of the first layer. The gap-forming materials forming the first layer is subsequently sublimated or evaporated and absorbed into the second layer to form a space between the resonator and the second layer with the resonator advantageously surrounded by the space for stable vibration.

8 Claims, 53 Drawing Figures

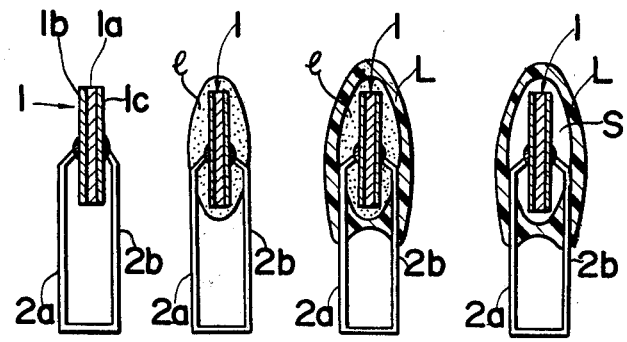
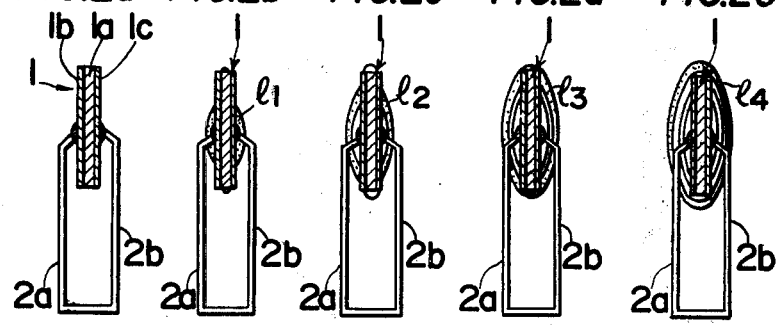
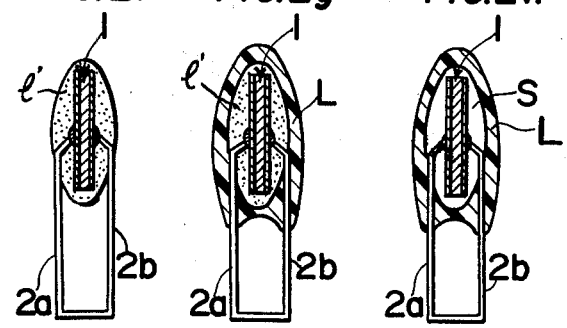

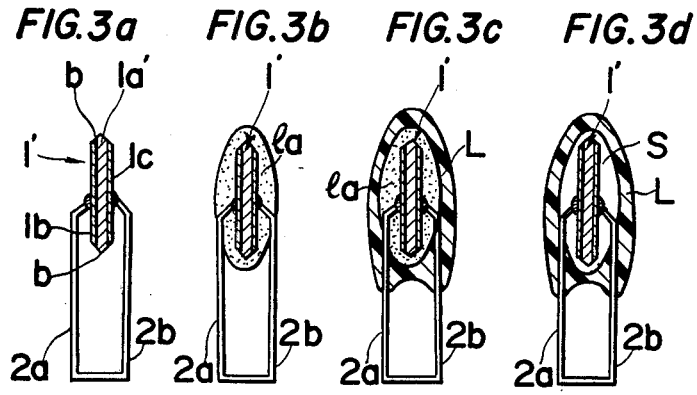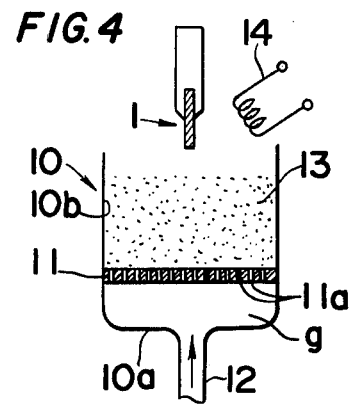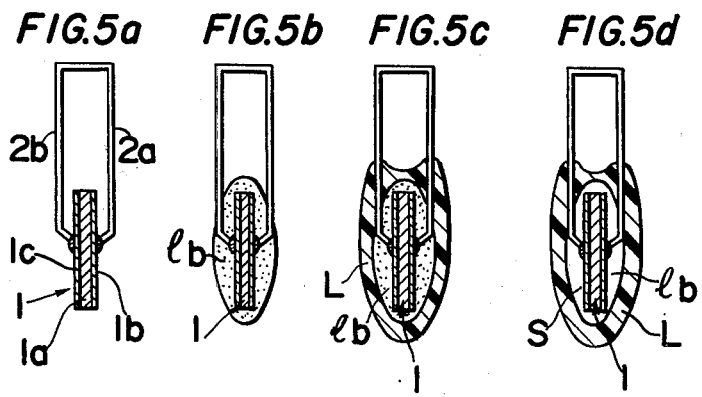

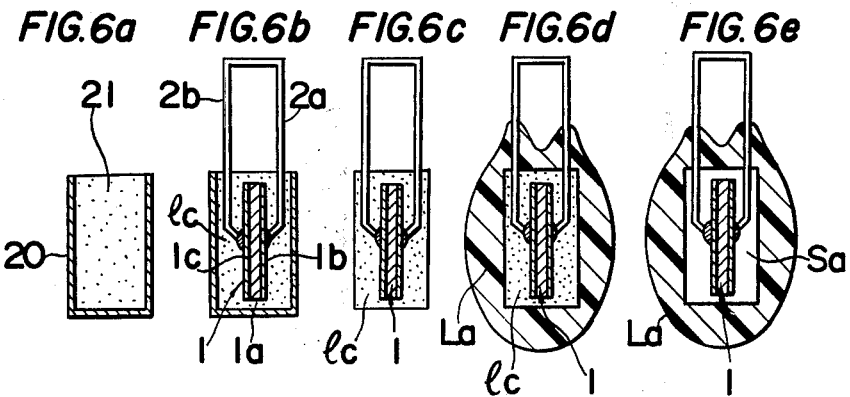
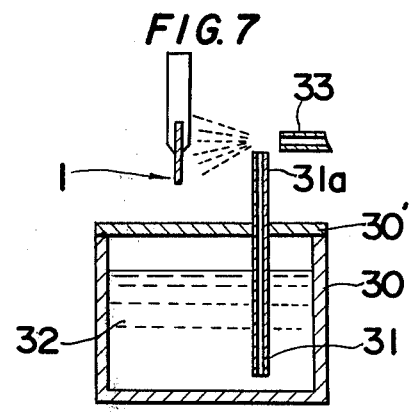
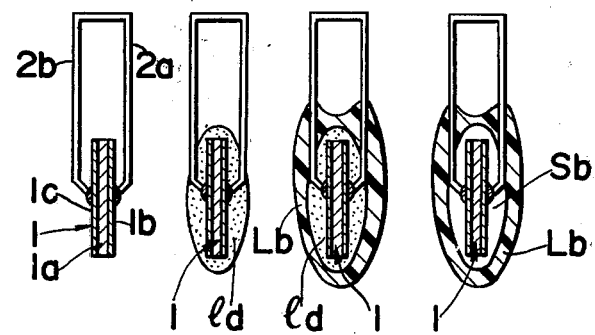

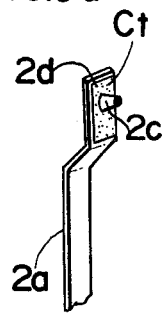 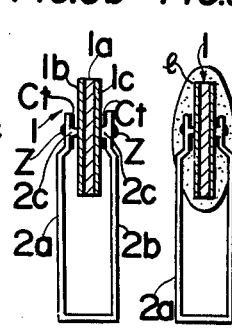 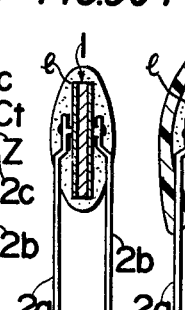 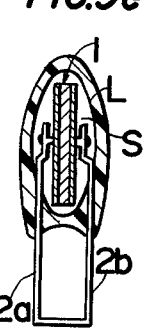
FIG.9a  FIG.9b  FIG.9c  FIG.9d  FIG.9e
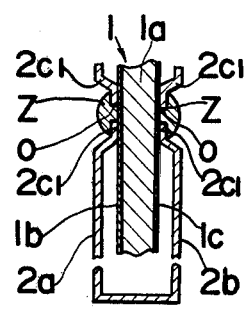 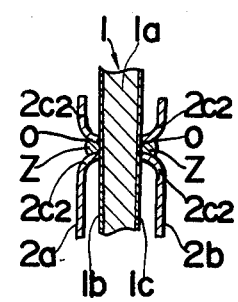 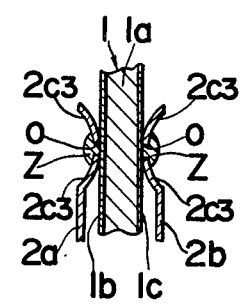
FIG. 10  FIG. 11  FIG. 12
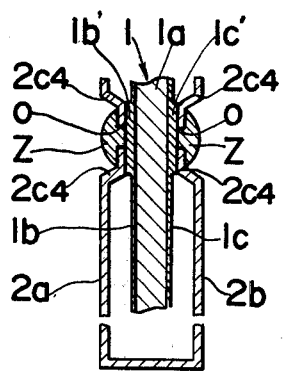 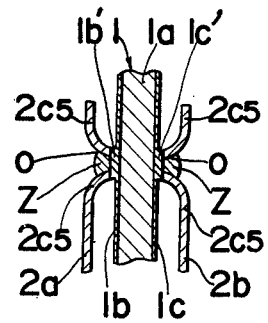 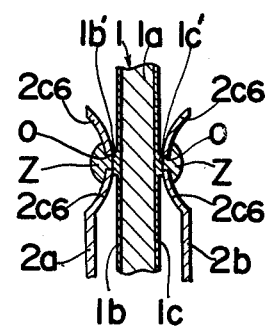
FIG. 13  FIG. 14  FIG. 15

PIEZOELECTRIC CERAMIC RESONATOR MOUNTING MEANS

This invention relates to a piezoelectric ceramic resonator, and more particularly to a general type of piezoelectric ceramic resonator vibrating in various modes, such as thickness, radial, expansion and bending modes, which is used as an electric filter, an impedance transformer, a delay line or an oscillator, and also to a manufacturing method of the ceramic resonator of the above described type suitable for mass production, by which method very efficient and economic manufacture of small sized ceramic filters with stable characteristics can be achieved.

It is to be noted that the term "piezoelectric ceramic" frequently referred to hereinafter includes ceramics which are prepared from fired polycrystalline ceramic materials, and which can provide, by operation of electrical polarization, piezoelectric characteristics generally similar to those inherent in certain natural dielectrics for example, quartz crystal or Rochelle salt, among which piezoelectric ceramics, barium titanate and lead titanatezirconate ceramics are well-known.

Commonly, in piezoelectric ceramic resonators utilizing the phenomemon that vibrational energies between small electrodes, provided partially on both surfaces of a thin piezoelectric ceramic plate, will be trapped only between the small electrodes and near them, it is essential to form a space or gap in the vicinity of the vibrating portion of the ceramic resonator so as not to damp vibrations in the electrode area, since the ceramic resonator vibrates only at such electrode area. Formation of this space, however, is extremely difficult from the point of view of manufacturing.

There has conventionally been proposed a manufacturing method of the ceramic resonator for facilitating the formation of such a space therein, which method includes steps as follows: forming a thin coating of wax or the like on the electrodes, formed on a piezoelectric ceramic plate; thereafter forming an insulative resinous layer on the coating of wax and applying heat thereto at or after the time of forming said insulative resinous layer for melting the wax coating and having the same absorbed into the insulative resinous outer layer to form space between the resonator electrodes and the insulative resinous outer layer.

However, in the conventional manufacturing method as described above, the spaces are formed only on the resonator electrodes with the periphery of the piezoelectric ceramic plate fixedly supported by the insulative resinous outer layer. By this construction, the use of the ceramic resonators produced is limited to the energy trapped type alone, and are not applicable to ceramic resonators of other vibration modes, such as thickness, radial, expansion and bending modes.

In another conventional manufacturing method, the ceramic resonator of the above described type is manufactured by the following steps: running external-connecting electrodes from resonator electrodes formed on a thin piezoelectric ceramic plate and connecting lead wires to said external connecting electrodes; covering resonator electrodes with spacers made of insulative materials such as synthetic resin so as to form spaces between the resonator electrodes and the spacers; and molding the whole ceramic assembly in a layer of insulative resin, or accommodating the whole ceramic assembly within a casing and injecting resin into the casing to surround them. The above manufacturing method of the ceramic resonator, however, has such disadvantages that the piezoelectric ceramic plate and resonator electrodes formed thereon are very small in size, thus making it extremely difficult and troublesome to place the spacers on the resonator electrodes.

As is seen from the foregoing description, such conventional methods are not only very inefficient, but the ceramic resonators produced thereby do not have fully satisfactory working and operating characteristics.

Accordingly, an essential object of the present invention is to provide an improved manufacturing method for a piezoelectric ceramic resonator which is applicable to ceramic resonators for various vibrating modes and which enables the mass production of such resonators very efficiently with substantial elimination of the disadvantages inherent in the conventional manufacturing methods.

Another important object of the present invention is to provide a piezoelectric ceramic resonator of this type which has stable working characteristics, and which is securely mechanically held such that the electrical characteristics thereof will not be affected.

A further object of the present invention is to provide a piezoelectric ceramic resonator of this type which is small in size and simple in construction with consequent low manufacturing cost.

According to a preferred embodiment of the present invention, the entire piezoelectric ceramic resonator comprising a piezoelectric ceramic plate with electrodes formed thereon is adapted to be covered by an insulative resinous layer with a space completely surrounding the ceramic resonator, which ceramic resonator is supported by outer connecting terminals, passing from each of said electrodes and being fixed in said insulative resinous layer. By this construction, the ceramic resonator is completely free from contacting any other elements and the vibration of the ceramic resonator is not damped by such elements, so that the original resonance characteristics of the ceramic resonator itself can be supplied as the output of the piezoelectric ceramic resonator which is applicable to various modes of vibration.

Furthermore, in a preferred embodiment of the present invention, the manufacturing method of the piezoelectric ceramic resonator comprises the following steps: dipping or immersing the ceramic resonator with electrodes, formed thereon and with the electrodes held between outer connecting terminals, into gap-forming materials in a molten state, which materials are easily sublimated or evaporated at a relatively low elevated temperature, to cover the entire ceramic resonator with a first layer of such gap-forming materials; subsequently forming an insulative resinous outer layer having many minute pores therein over the entire surface of the ceramic resonator so as to cover the surface of the said first layer of the gap-forming materials; applying heat thereto at or after the time of forming the insulative resinous outer layer; and simultaneously sublimating or evaporating the gap-forming material and permitting the gap-forming material to be absorbed into the insulative resinous layer, and in some cases, further to be dispersed outwardly through the pores of said outer layer, thereby forming the space or gap completely surrounding the whole resonator between the ceramic resonator and the insulative resinous outer layer. By this method, the disadvantages inherent in the prior art ceramic resonators, such as damping or suppression of the vibration of the resonators resulting in reduction of working characteristics, or difficult and troublesome procedures of positioning the spacers in the manufacturing thereof, are advantageously eliminated so that mass production of ceramic resonators with stable working characteristics can be very efficiently effected.

Figure 17A:
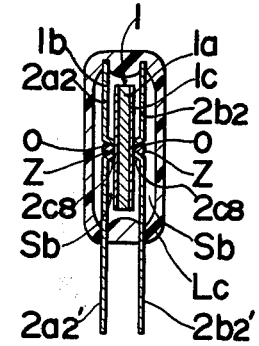
Figure 16B:
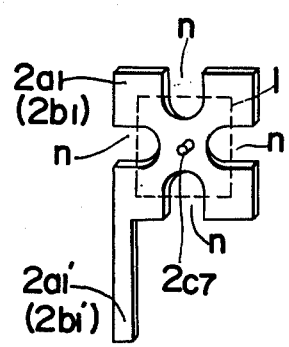
Figure 17B:
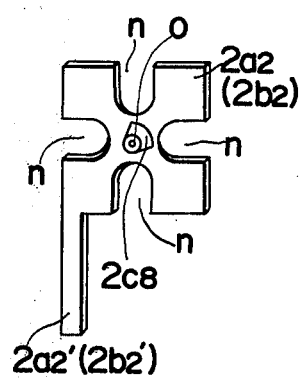

These and other objects and features of the present invention will become apparent from the following description taken in conjunction with the preferred embodiment thereof with reference to the accompanying drawings, in which;

FIG. 1 (a) is a sectional view of an electrical filter using an energy trapped type ceramic resonator with an insulative resinous outer layer removed, FIGS. 1b) to 1(d) are sectional views of one embodiment of the method of the invention showing each step in the process of manufacture of the filter, FIG. 2(a) is a similar view to FIG. 1(a), but shows a first modification of the embodiment of FIG. 1(a), FIGS. 2(b) to 2(h) are similar views to FIGS. 1(b) to 1(d), but show a first modification of the embodiment of FIGS. 1(b) to 1(d), FIG. 3(a) is a similar view to FIG. 1(a), but shows a second modification of the embodiment of FIG. 1(a), FIGS. 3(b) to 3(d) are similar views to FIGS. 1(b) to 1(d), but show a second modification of the embodiment of FIGS. 1(b) to 1(d), FIG. 4 shows a schematic diagram showing a process for applying gap-forming material to a ceramic resonator according to a third modification of the embodiment of FIGS. 1(a) to 1(d), FIG. 5(a) is a similar view to FIG. 1(a), but shows a third modification of the embodiment of FIG. 1(a), FIGS. 5(b) to 5(d) are similar views to FIGS. 1(b) to 1(d), but show a third modification of the embodiment of FIGS. 1(b) to 1(d), FIGS. 6(a) to 6(e) are similar views to FIGS. 1(a) to 1(d), but show a process for applying gap-forming material to a ceramic resonator according to a fourth modification of the embodiment of FIGS. 1(a) to 1(d), FIG. 7 is a similar view to FIG. 4, but shows a modification of a process for applying gap-forming material to a ceramic resonator according to a fifth modification of the embodiment of FIGS. 1(a) to 1(d), FIGS. 8(a) to 8(d) are similar views to FIGS. 1(a) to 1(d), but show a fifth modification of the embodiment of FIGS. 1(a) to 1(d), FIG. 9(a) is a perspective view, partly broken away, showing construction of an outer terminal employed in the modification of FIGS. 9(a) to 9(d), FIG. 9(b) is a similar view to FIG. 1(a), but shows a sixth modification of the embodiment of FIG. 1(a), FIGS. 9(c) to 9(e) are similar views to FIGS. 1(b) to 1(d), but show a sixth modification of the embodiment of FIGS. 1(b) to 1(d), FIGS. 10 to 15 show sectional views, partly broken away, of seventh to twelfth modifications of the embodiment of FIG. 1(a), particularly with respect to connections between the resonator electrodes and terminal plates for outer terminals, FIG. 16(a) is a similar view to FIG. 1(d), but shows a thirteenth modification of the embodiment of FIG. 1, FIG. 16(b) is a perspective view showing construction of a terminal plate employed in the modification of FIG. 16(a), FIG. 17(a) is a similar view to FIG. 1(d), but shows a fourteenth modification of the embodiment of FIG. 1, FIG. 17(b) is a perspective view showing construction of a terminal plate employed in the modification of FIG. 17(a), FIGS. 18(a) to 18(d) are similar views to FIGS. 1(a) to 1(d), but show another modification of the embodiments of FIGS. 16(a) to 17(b), and FIGS. 19 to 21 show sectional views, partly broken away, of fifteenth to seventeenth modifications of the embodiment of FIG. 1, particularly with respect to connections between the resonator electrodes and terminal plates for outer terminals.

Before the description of the present invention proceeds, it should be noted that like parts are designated by like reference numerals throughout the several views of the accompanying drawings.

Referring to FIGS. 1(a) to 1(d), the piezoelectric ceramic wafer 1 comprises a piezoelectric ceramic base 1a of titanic acid, zirconate etc., with an electrode 1b formed on one surface of the base 1a and an electrode 1c formed on the other surface thereof, and with outer terminals 2a and 2b rigidly secured at the upper ends thereof to the electrodes 1b and 1c at the nodes or positions close to the nodes of the latter, for example, by soldering. The piezoelectric ceramic wafer 1 is subsequently immersed or dipped in a melt of gap-forming materials such as wax, paraffin, vaseline, etc. having viscosity at normal temperature so as to form a first layer l of the gap-forming material on all the surfaces of the ceramic resonator 1.

The ceramic resonator 1 with the first layer l formed thereon is subjected to air drying or drying by heat, and subsequently dipped into a liquid comprising a porous thermosetting insulative resinous material such as epoxy resin or phenolic resin to form a second layer L on the outer surface of the first layer l. In the next step, the second layer L is heated after drying so that the gap-forming material forming the first layer l is liquefied or vaporized, thereby being absorbed into the porous second layer L. Alternatively, the gap-forming first layer l can be dispersed outwardly through the pores in the second layer L. Consequently, a space or gap S is formed in the volume previously occupied by the first layer l of the gap-forming material, and the outer terminals 2a and 2b are secured by the second layer L as in FIG. 1(d).

The outer terminals 2a and 2b which are shown to be connected to each other at the lower portions at this stage in FIGS. 1(a) to 1(d) for convenience in manufacturing are cut apart to form separate outer terminals 2a and 2b at a suitable later process. Accordingly, because the ceramic resonator 1 is now completely surrounded by the space S, such that the vibration of the resonator 1 is not damped nor suppressed regardless of the modes of vibration, piezoelectric ceramic resonators having desired operating and working characteristics can be obtained.

It should be noted here that the melt of the gap-forming materials of wax, paraffin, vaseline, etc. into which the piezoelectric ceramic resonator 1 is dipped is not necessarily a "melt", but may also be of a solution of the same, although this will be referred to as "melt" hereinafter.

Referring now to FIGS. 2(a) to 2(h), there is shown a first modification of the embodiment of FIGS. 1(a) to 1(d). In this modification, the piezoelectric ceramic resonator 1 of the same construction as in the embodiment of FIG. 1(a) is repeatedly dipped into melts of gap-forming materials of wax, paraffine, vaseline, etc., beginning with a melt of a material having a high melting point and continuing to one having a low melting point.

In the initial dipping, the gap-forming material adheres only to a part of the surface of the ceramic resonator 1 to form a thin layer $l_1$ as shown in FIG. 2(b), and as the resonator 1 is sequentially dipped into other melts, the gap-forming materials adhere to the surface of the resonator 1, one after another in layers $l_2$ to $l_4$ as in FIGS. 2(c) to 2(e). Upon completion of the dippings, when the whole surface of the ceramic resonator 1 is completely covered with the gap-forming materials as in FIG. 2(f), the layer l' of the gap-forming materials surrounding the ceramic resonator 1 is formed. The processes for forming the porous second layer L of thermosetting resinous material on the other surface of the first layer l' and for forming the space S between the resonator 1 and the second layer L are exactly the same as those in the embodiment of FIGS. 1(a) to 1(d), so that description thereof is abbreviated for brevity.

Referring to FIGS. 3(a) to 3(d), there is shown a second modification of the embodiment of FIGS. 1(a) to 1(d), in which second modification, the piezoelectric ceramic wafer 1' has edges thereof suitably bevelled as at b, although the remaining structure of the ceramic resonator is the same as that in the embodiments of FIGS. 1(a) to 1(d) and FIGS. 2(a) to 2(h). The bevelled edges b of the ceramic wafer 1' is effective for the formation of a desirable first layer 1a around the wafer 1' by a single, or by a small number of dippings contributing to improved efficiency for manufacturing the ceramic resonators of the above described type.

Referring now to FIGS. 4 to FIG. 5(d) in which a third modification of the embodiment of FIG. 1 is shown, a container 10, having a pipe 12 for sending air thereinto formed at a middle portion in the bottom 10a of the container 10, is further provided therein with a plate 11 having many openings 11a. The plate 11 is supported horizontally by the inside wall 10b of the container 10 at a position slightly above and in parallel to the bottom 10a of the container 10 with a space g maintained between the bottom 10a and the plate 11 as shown in FIG. 4.

Gap-forming materials of wax, paraffin, vaseline, etc. in the form of powder 13 are put into the container 10 on the plate 11, and subsequently air is sent into the container 10 through the pipe 12 for stirring the powder 13. A piezoelectric ceramic resonator 1 of the same construction as that in the embodiment of FIG. 1(a) is heated by a heater 14, provided at a suitable position above the container 10, and subsequently inserted into the powder 13 being stirred, as described above. The powder 13 adheres to the whole surface of the ceramic resonator 1 and fuses thereto, so as to form a first layer 1 b on the resonator 1 as in FIG. 5(b). The processes for forming the porous second layer L of thermosetting resinous material on the outer surface of the first layer 1 b and for forming the space S between the resonator 1 and the second layer L are the same as those in the embodiment of FIGS. 1(a) to 1(d), so that description thereof is abbreviated for brevity.

Reference is now made to FIGS. 6(a) to 6(e), in which a fourth modification of the embodiment of FIG. 1 is shown. In this modification, gap-forming materials 21 of wax, paraffin vaseline, etc., for example, in the form of powder, are placed in a container 20 with the container subsequently heated to fuse the materials 21 contained therein. The piezoelectric ceramic resonator 1 of similar construction to that in the embodiment of FIG. 1 is dipped in the fused gap-forming materials 21, and subsequently, the container 20, together with the materials 21 contained therein, is cooled to form a first layer 1 c of gap-forming material 21 around the ceramic resonator 1. The resonator 1 with the hardened layer 1 c of the gap-forming materials 21 formed thereon is removed from the container 20. In this modification, also, the processes for forming the porous second layer La, as shown in FIG. 6(d), on the outer surface of the first layer 1 c of the gap-forming materials 21 and for forming the space Sa between the resonator 1 and the second layer La are similar to those in the embodiment of FIGS. 1(a) to 1(d), so that description thereof is abbreviated for brevity.

Referring now to FIGS. 7 to 8(d), there is shown a fifth modification of the embodiment of FIGS. 1(a) to 1(d). In this modification, a container 30, containing the gap-forming materials 32 of wax, paraffin, vaseline, etc. in a molten state, is provided with a cover plate 30' thereon. A pipe 31 extends through the cover plate 30' in a direction at right angles to the surface of the plate 30' with one end of the pipe 31 immersed in the molten gap-forming material 32. The other upper end of the pipe 31 is formed into a spray nozzle 31a, and an air nozzle 33 is suitably disposed adjacent to the spray nozzle 31a for directing air flow toward the nozzle 31a to spray the gap-forming material 32 therefrom.

A piezoelectric ceramic resonator 1 of similar construction to the one in the embodiment of FIG. 1(a) is subsequently placed in the spray of the gap-forming material 32, being sprayed from the nozzle 31a, for adhering the material 32 to the entire surface of the ceramic resonator 1, thereby forming a first layer 1 d of the gap-forming material 32 thereon as shown in FIG. 8(b). The processes for forming a porous second layer Lb on the outer surface of the first layer 1 d of the gap-forming material 32 and for forming a space Sb between the resonator 1 and the second layer Lb are similar to those in the embodiment of FIGS. 1(a) to 1(c), so that description thereof is abbreviated for brevity.

Reference is now made to FIGS. 9(a) to 9(e), in which a sixth modification of the embodiment of FIGS. 1(a) to 1(d) is shown. In this modification, a small projection 2c, centrally bored, is formed on the upper end surface 2d of each of the terminal plates 2a and 2b in a position facing each of the electrodes 1b and 1c of the piezoelectric ceramic wafer 1. The surface 2d is coated with materials Ct, such as aluminum, heat-resistant resin, etc. to which solder does not normally adhere as is shown in FIG. 9(a). The terminal plates 2a and 2b are initially connected to each other at the lower portions thereof, as in FIG. 9(b), and the piezoelectric ceramic wafer 1 is held, at the nodes or at points close to the nodes thereof, between the projections 2c formed at the upper open ends of the terminal plates 2a and 2b. Subsequently, the projections 2c are soldered to each of the electrodes 1b and 1c with solder Z through the bores formed in the projections 2c to rigidly secure the terminal plates 2a and 2b to the electrodes 1b and 1c.

It should be noted here that each of the projections 2c, centrally bored, should be formed with as small of a contact area as possible so as not to hinder the vibration of the ceramic resonator 1. The projections should each extend toward the electrodes 1b and 1c, as well.

It should also be noted that other materials, such as electrically conductive coating material or adhesive, may be used for adhering the projections $2c$ to the electrodes $1b$ and $1c$ instead of solder. In this case, if such a material is one having suitable viscosity at normal temperature, suppression of the vibration of the resonator 1 will be reduced.

In the above described modification of FIGS. 9(a) to 9(e), since the portions $2d$ at the upper end surfaces of the terminal plates $2a$ and $2b$ facing the electrodes $1b$ and $1c$ are advantageously coated, except for the projections $2c$, with the materials Ct to which soldering cannot be made, the nodes of the ceramic resonator 1 can be positively fixed by the projections $2c$ through soldering at the smallest area, whereby the loss of the resonator 1 is reduced to the minimum level. The processes for the formation of the first layer l of the gap-forming material on the resonator 1, the porous second layer L of thermosetting resinous material on the outer surface of the first layer l, and the space S between the resonator 1 and the second layer L are the same as those in the embodiment of FIGS. 1(a) to 1(d). In addition, the processes for forming the first layer of gap-forming material disclosed in the modifications of FIGS. 3(a) through to FIG. 8(d) are also applicable to the above modification of FIGS. 9(a) to 9(e), and description thereof is abbreviated for brevity.

Referring now to FIGS. 10 through to 15, there are shown seventh through twelfth modifications of the embodiment of FIGS. 1(a) to 1(e). These modifications relate particularly to the methods for adhering terminal plates to the electrodes $1b$ and $1c$ of the ceramic resonator 1. The processes for the formation of the first layer of gap-forming material on the resonator 1, the porous second layer of thermosetting resinous material on the first layer, and the space between the resonator 1 and the second layer are the same as in the embodiment of FIGS. 1(a) to 1(d), as well as the modifications of FIGS. 2(a) to 9(d), so that description thereof is dispensed with brevity.

In the arrangement of FIG. 10, a dish-shaped protuberance $2c_1$, centrally bored with an opening O and raised toward the electrode $1b$ or $1c$ of the ceramic wafer 1, is formed on the upper end of each of the terminal plates $2a$ and $2b$. The terminal plates $2a$ and $2b$ having sufficient strength to suit the objects of the invention are connected to each other, at the lower portions thereof at this stage for separation at a later process, and the piezoelectric ceramic wafer 1 is held, at the nodes or at points close to the nodes thereof, between the protuberances $2c_1$ at the upper open ends of the terminal plates $2a$ and $2b$. Subsequently, the protuberances $2c_1$ are soldered to each of the electrodes $1b$ and $1c$ and with solder Z through the openings O formed in the protuberances $2c_1$ such that the terminal plates $2a$ and $2b$ are rigidly secured to the electrodes $1b$ and $1c$.

In the modification of FIG. 11, protuberances $2c_2$, having a funnel-shaped cross-section with openings O formed in the centers thereof, are employed, while in the embodiment of FIG. 12 protuberances $2c_3$ of semi-circular cross-section with similar openings O are utilized, instead of such dish-like protuberances $2c_1$ as in the arrangement of FIG. 10.

In each of the modifications of FIGS. 13 to 15, protrusions $1b'$ and $1c'$, of approximately the same size as the contact face of the protuberances $2c_4$, $2c_5$ or $2c_6$, and of the same material as the electrodes $1b$ and $1c$, are formed on the electrodes $1b$ and $1c$ respectively at positions corresponding to the nodes or points close to the nodes of the electrodes $1b$ and $1c$ by known methods, such as printing and coating. The height, or raised amount, of each of these protrusions $1b'$ and $1c'$ is, for example, $100\mu$. In each of the modifications of FIGS. 13 to 15, protuberances $2c_4$, $2c_5$ or $2c_6$ with the openings O in the central portion thereof are adapted to hold the piezoelectric ceramic wafer 1 therebetween in such a manner that the center of each of the openings O of the protuberances coincides with the center of corresponding protrusion on the electrode. Moreover, the protuberances $2c_4$, $2c_5$ or $2c_6$ are subsequently soldered to the corresponding protrusions $1b'$ and $1c'$ on the electrodes $1b$ and $1c$ with the solder Z through the openings O formed in each of the protuberances $2c_4$, $2c_5$ or $2c_6$.

In these modifications of FIGS. 10 to 15, the shape of the protuberances $2c_1$, $2c_2$, $2c_3$, $2c_4$, $2c_5$ or $2c_6$ is not limited to the ones described or employed therein, but may be of any shape as long as each protuberance has as small of a contact area as possible with respect to the electrode surface of the resonator 1 so as not to hinder the vibration of the resonator 1, being convexly raised toward the electrode of the resonator 1 with an opening formed in the central portion of the protuberance. Similarly, material for adhering the protuberance $2c_4$, $2c_5$ or $2c_6$ to the electrode is not limited to solder, but other materials such as electrically conductive coating or adhesive may be employed. In such case, materials having suitable viscosity at normal temperature may be effective for reducing suppression of vibration of the resonator 1.

Referring now to FIGS. 16(a) to 17(b), there are shown a thirteenth and a fourteenth modifications of the embodiment of FIG. 1. In the modification of FIGS. 16(a) and 16(b), each of terminal plates $2a_1$ and $2b_1$ of an approximate square shape having an external form larger than that of the piezoelectric ceramic wafer 1, as shown in the dotted line in FIG. 16(b), is provided with a protrusion $2c_7$ at the central portion thereof with a notch n formed at the middle portion of each of the side edges of the square shaped terminal plate. Further, terminal strips $2a_1'$ or $2b_1'$ extend outwardly from one corner of each terminal plate $2a_1$ or $2b_1$ in a direction parallel to one of the sides of the square shaped terminal plate $2a_1$ or $2b_1$. The piezoelectric ceramic wafer 1 is held, at the nodes or points close to the nodes thereof, between the protrusions $2c_7$ of the terminal plates $2a_1$ and $2b_1$, whose terminal strips $2a_1'$ and $2b_1'$ are connected to each other for separation at a later stage, with the protrusion $2c_7$ pressed against the corresponding node points.

In this arrangement, the entire ceramic resonator 1, except for the terminal strips $2a_1'$ and $2b_1'$, is covered with the porous second layer Lc of thermosetting resinous material around the space Sb with the outer edges of the terminal plates $2a_1$ and $2b_1$ simultaneously secured to the second layer Lc. In this case, however, it should be noted that the notched portions n formed on the side edges of the terminal plates $2a_1$ and $2b_1$ are not covered with the second layer Lc, so that the vibration of the resonator 1 is not suppressed by the layer Lc.

In the modification of FIGS. 17(a) and 17(b), a cup-shaped protrusion $2c_8$, which is centrally bored with openings O, is formed on each of the terminal plates $2a_2$ and $2b_2$, instead of the protrusions $2c_7$ although the remaining structure of the terminal plates $2a_2$ and $2b_2$ is similar to that in the arrangement of FIGS. 16(a) and 16(b). The piezoelectric ceramic wafer 1 is held at the nodes or points close to the nodes thereof between the protrusions $2c_8$ of the terminal plates $2a_2$ and $2b_2$, and subsequently, the protrusions $2c_8$ and the corresponding electrodes 1b and 1c are fixedly soldered to each other with solder Z through the openings O formed in the protrusions $2c_8$. In this case, also, the entire ceramic resonator 1, surrounded by the porous second layer Lc around the space Sb, except the terminal strips $2a_2'$ and $2b_2'$, is prevented from reduction of vibration by the presence of the notches n around the outer edges of the terminal plates $2a_2$ and $2b_2$.

In the above embodiments of FIGS. 16(a) to 17(b), the formation of the space Sb and the porous second layer Lc is effected in a similar manner to the one described in FIGS. 18 (a) to 18 (c) hereinbelow, so that description thereof is abbreviated for brevity.

Reference is made to FIGS. 18(a) to 18(d) in which there is shown another modification of the embodiment of FIGS. 16(a) and 16(b). In this modification, the piezoelectric ceramic wafer 1 is held at the nodes or at points close to the nodes thereof between projections $2c_9$ formed on terminal plates $2a_3$ and $2b_3$ of similar construction to those in the modification of FIGS. 16 (a) and 16(b) with the projections $2c_9$ pressed against the corresponding node points. A heat-shrinkable film T, for example, of a ring configuration is slipped on or suitably formed around the terminal plates $2a_3$ and $2b_3$ so that the resonator 1 is surrounded by the film T. This film T is intended to be shrunk by the application of heat to provide pressure of the terminal plates $2a_3$ and $2b_3$ on the resonator 1 for securely holding the same therebetween. The resonator 1 temporarily held between the terminal plates $2a_3$ and $2b_3$, as described above, is subsequently immersed or dipped in the melt of gap-forming materials such as wax, paraffin, vaseline, etc. in a similar manner to the one in the embodiment of FIG. 1, thereby covering the entire resonator 1 and filling the space between the terminal plates $2a_3$ and $2b_3$ with the gap-forming material. The gap-forming material also adheres to the outer surfaces of the plates $2a_3$ and $2b_3$, except for the peripheral edges of the plates $2a_3$ and $2b_3$, such that a first layer 1 e of gap-forming material is formed around the resonator 1. Since the resonator 1 held between the terminal plates $2a_3$ and $2b_3$ is smaller in external form than the plates $2a_3$ and $2b_3$, the entire resonator 1 is positively covered with the layer 1 e of gap-forming material as in the modifications of FIGS. 16(a) to 17(b).

It should be noted here that the heat-shrinkable film T may be slipped on or formed around the terminal plates $2a_3$ and $2b_3$ after the resonator 1 held between the plates $2a_3$ and $2b_3$ has been dipped in the gap-forming material.

The resonator 1 with the first layer 1 e thus formed thereon is subject to air drying or drying by heat, and subsequently dipped into a liquid of a porous thermosetting insulative resinous material, such as epoxy resin or phenolic resin, to form a second layer Ld on the outer surface of the first layer 1 e. Subsequently, the second layer Ld is heated, after drying so that the heat-shrinkable film T is completely shrunk against terminal plates $2a_3$ and $2b_3$ to securely hold the resonator 1. Simultaneously, the gap-forming material forming the first layer 1 e is liquefied or vaporized so as to be absorbed into the porous second layer L, or further to be dispersed outwardly through the pores in the second layer Ld. Consequently, a space Sc is formed in the place once occupied by the first layer 1 e of the gap-forming material, in which case the notches n formed at side edges of the terminal plates $2a_3$ and $2b_3$ in a similar manner as in the modifications of FIGS. 16(b) and 17(b) are effective for the absorption or dispersion of the gap-forming material into or through the porous second layer Ld.

In any of the arrangements of FIGS. 16(a) to 18(d), since the space is formed surrounding the entire surface of the resonator 1 with the side edges of the terminal plates secured by the porous second layer, the vibration of the resonator 1 is not suppressed at all, irrespective of the modes of vibration, and ceramic resonators of any desired type can be readily obtained.

Figure 18A:
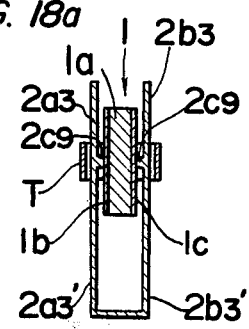
Figure 18B:
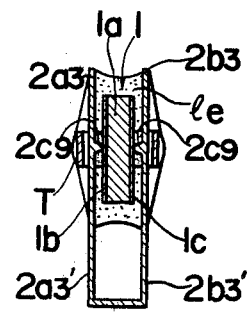
Figure 18C:
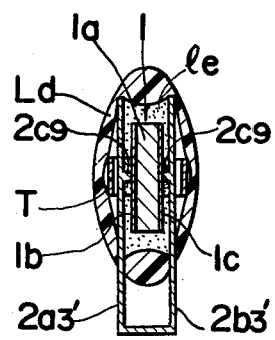
Figure 18D:
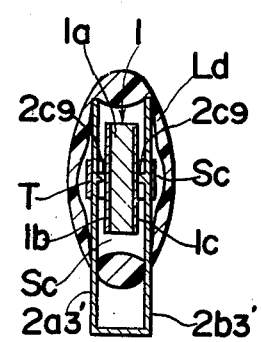

Furthermore, in the modification of FIGS. 18(a) to 18(c), because the terminal plates $2a_3$ and $2b_3$ are pressed towards the surfaces of the resonator 1 by the shrinkage of the heat-shrinkable film T, the tips of the protrusions $2c_9$ can be made sufficiently narrow for point contact between the terminal plates and the resonator 1. By this arrangement, since the terminal plates are not soldered to the resonator electrodes, disadvantages encountered in the conventional methods are advantageously eliminated. Namely, the conventional techniques result in that the solder tends to disperse on the electrodes of the resonator to an unnecessary extent in soldering, thereby hindering point contact between the terminal plates and the resonator electrodes and increasing the loss of the resonator due to increased resonance resistance thereof; or that the electrodes tend to be deteriorated by the heat of soldering iron; or that the unnecessarily strong soldering bond between the electrodes and the terminal plates tends to cause the electrodes to peel off the ceramic base plate due to shock, especially when bonding therebetween is rather weak. Moreover, since the terminal plates are not soldered to the electrodes in the embodiment of FIGS. 18(a) to 18(d), mechanical damping of the terminal plates and the resonator is substantially decreased, thereby resulting in the reduction of losses of the resonator.

Figure 19:
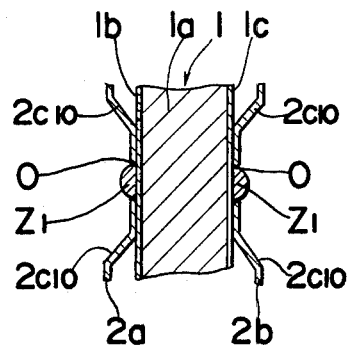
Figure 20:
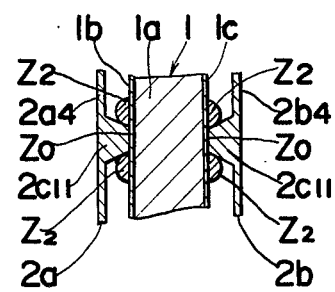
Figure 21:
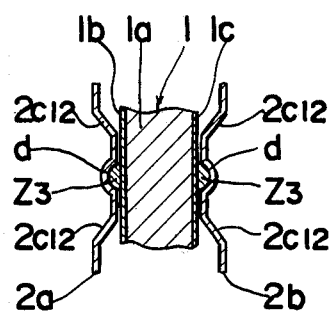

Referring now to FIGS. 19 to 21, there are shown further modifications of the embodiment of FIG. 1. For example, in an arrangement of FIG. 19, a projection Z1 is formed on the node or a point close to the node of each of the electrodes 1b and 1c by either an electrically conductive material or solder. A dish-like protuberance $2c_{10}$, centrally bored with an opening O, is formed on each of the upper portions of the terminal plates 2a and 2b with the protuberances $2c_{10}$ being raised toward corresponding electrodes 1b and 1c and with the openings O in the protuberances $2c_{10}$ being fitted into the projections Z1 of the electrodes 1b and 1c. The terminal plates 2a and 2b are connected at the lower portions thereof (not shown) at this stage for separation at a later process, and the projections Z1 are pressed against the protuberances $2c_{10}$ elastically, in which case, the surfaces of the protuberances $2c_{10}$ may be in direct contact with the electrodes 1b and 1c. However, when in direct contact therewith, the former should contact the latter in such an extent that the vibration of the resonator 1 is not hindered.

In the modification of FIG. 20, a projection Z2 in the form of a ring of electrically conductive material, such as solder, is formed on the node or a point close to the node of each the electrode surfaces 1b and 1c, while projections $2c_{11}$ each extend toward the electrode 1b or $1c$. Projections $2c_{11}$ are formed on each of the terminal plates $2a_4$ and $2b_4$ with the tips of the projections $2c_{11}$ engaging with the concave portions Z0 formed in the centers of the ring-shaped projection Z2 on the electrodes $1b$ and $1c$ and with the projections $2c_{11}$ elastically pressed against the concave portions Z0 of the ring-shaped projections Z2.

In the arrangement of FIG. 21, a projection Z3 of similarly electrically conductive material, for example, of solder, is formed on the node or a point close to the node of each of the electrode surfaces $1b$ and $1c$. Each of the dish-like protuberances $2c_{12}$ of this embodiment has a concave portion, or dint, $d$ formed in the central portion of the protuberance $2c_{12}$ in a position corresponding to the projection Z3. Each of these dints d fits over the projection Z3 on the electrode with the dints d elastically pressed against the projections Z3 by a force urging the terminal plates $2a$ and $2b$ toward the electrodes $1b$ and $1c$. The terminal plates $2a$ and $2b$ are connected at the lower portions (not shown) thereof at this stage, but can be separated in a suitable later process.

The resonators in the modifications of FIGS. 19 to 21 are characterized in that projections of electrically conductive materials are formed on the electrodes of the ceramic wafer with terminal plates provided with portions elastically pressing on and engaging the projections. Accordingly, the resonators of the above described type of the invention have small positive contact area between the resonator and the terminal plates as compared with that of the type in which the resonator and the terminal plates are soldered to each other. The structure of FIGS. 19 to 21 results in less mechanical damping and loss. Furthermore, since the terminal plates, provided with the holding portions, such as dints, openings, etc., are elastically pressed on and engage the projections formed on the nodes or points close to the nodes on the electrodes, the supporting points for the resonator are always kept in the vicinity of the nodes even when a shock is given to the resonator. Consequently, stable working characteristics of the resonator occur, and the possibility for the electrodes to be peeled off the ceramic base plate are advantageously eliminated.

Additionally, the fact that the resonator is securely held between the terminal plates without soldering leads to manufacturing ease and mass production of the resonators. Since the processes of application of gap-forming material on the resonator, and formation of the space between the porous outer layer and the resonator are the same as those in the modifications of FIGS. $16(a)$ to $18(d)$, the description thereof is abbreviated for brevity. It should also be noted that the processes described in the embodiment of FIG. 1 and the modifications of FIGS. 2 through to 15 may be appled to the modifications of FIGS. 19 to 21, depending on the requirements.

It should be noted also that although the embodiment and modifications in the foregoing description are based on two terminal electrode-electrical filters, the method described is also applicable to three or more terminal electrode-electrical filters as well.

Furthermore, it is needless to say that the ceramic resonator referred to in the foregoing description may be composed of natural dielectrics, such as a quartz crystal and Rochelle salt, as well as piezoelectric ceramics of barium titanate or lead titanate-zirconate. In addition, the resonator may be in the form of a mechanical filter composed of a piezoelectric element affixed on a metal body.

Although the present invention has been fully described by way of example with reference to the attached drawings, it is to be noted that various changes and modifications are apparent to those skilled in the art. Therefore, unless otherwise such changes and modifications depart from the scope of the present invention, they should be construed as included therein.

What is claimed is:

1. A piezoelectric ceramic resonator which comprises a piezoelectric ceramic wafer including a piezoelectric ceramic plate and electrodes formed thereon, at least two outer terminal plates each having at one end portion thereof an engaging portion, means for holding said engaging portion of each terminal plate to said electrodes at a position corresponding to a node or a point close to said node of each of said electrodes, such that said ceramic wafer is held between said engaging portions of said outer terminals to provide a resonator structure, and a porous outer layer of thermosetting resinous material surrounding said ceramic resonator with a space provided therebetween, said space completely surrounding said resonator structure, wherein a portion of each of said outer terminal plates is secured to said porous outer layer for effecting free vibration of said resonator structure in operation thereof, wherein said engaging portion of said outer terminal plate includes an approximately square portion having a larger dimension than that of said ceramic wafer, said square portion being formed with a notch in each side edge of said square portion, and a projection which extends toward said node or said point close to said node of each of said electrodes, said projection being formed in a central portion of said square portion, and wherein said side edge of said square portion of said terminal plate is secured in said porous outer layer except for said notch, and said projection on said square portion is pressed against said node or said point close to said node of each of said electrodes for positively holding said ceramic wafer between said projections on said square portions, so that said resonator structure is completely surrounded by said space between said resonator structure and said porous outer layer for stable vibration.

2. A piezoelectric ceramic resonator as claimed in claim 1, wherein said ceramic wafer includes bevelled edges.

3. A piezoelectric ceramic resonator as claimed in claim 1, wherein said spacing is formed by a gap-forming material initially completely surrounding the entire outer periphery of said resonator structure, said gap-forming material being vaporized and absorbed into said porous outer layer to form said spacing.

4. A piezoelectric ceramic resonator as claimed in claim 1, wherein said resonator structure further includes a film of heat-shrinkable material which surrounds said square portions of said terminal plates at a position where said ceramic wafer is held between said projections on said square portions, said film being shrinkable by application of heat thereto so as to press said projections of said square portions of said terminal plates firmly against said nodes or said points close to said nodes of said electrodes.

5. A piezoelectric ceramic resonator as claimed in claim 1, wherein said projection includes a central bore, so that said projection is connected to said node or said point close to said node of each of said electrodes through said central bore formed in said projection.

6. A piezoelectric ceramic resonator as claimed in claim 5, wherein said means for holding said engaging portion of each of said outer terminal plates includes a solder connection of said projection to said node or said point close to said node of each of said electrodes.

7. A piezoelectric ceramic resonator as claimed in claim 5, wherein said means for holding said engaging portion of said outer terminal plate includes an electrically conductive material having proper viscosity at normal temperature for connecting said projection to said node or said point close to said node of each of said electrodes.

8. A piezoelectric ceramic resonator as claimed in claim 5, wherein said engaging portion includes a layer of material having no affinity for solder, such that only said projection is connected to said node or said point close to said node of each of said electrodes, thereby providing a minimum contact area therebetween through said central bore of said projection.

* * * * *